(12) United States Patent
Kondoh

(10) Patent No.: US 10,347,510 B2
(45) Date of Patent: Jul. 9, 2019

(54) SUBSTRATE TRANSFER CHAMBER, SUBSTRATE PROCESSING SYSTEM, AND METHOD FOR REPLACING GAS IN SUBSTRATE TRANSFER CHAMBER

(71) Applicant: TOKYO ELECTRON LIMITED, Tokyo (JP)

(72) Inventor: Keisuke Kondoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/747,066

(22) PCT Filed: Jun. 7, 2016

(86) PCT No.: PCT/JP2016/066909
§ 371 (c)(1),
(2) Date: Jan. 23, 2018

(87) PCT Pub. No.: WO2017/013959
PCT Pub. Date: Jan. 26, 2017

(65) Prior Publication Data
US 2018/0211850 A1    Jul. 26, 2018

(30) Foreign Application Priority Data
Jul. 23, 2015   (JP) .................... 2015-145398

(51) Int. Cl.
*H01L 21/67*    (2006.01)
*H01L 21/677*    (2006.01)

(52) U.S. Cl.
CPC .. *H01L 21/67017* (2013.01); *H01L 21/67196* (2013.01); *H01L 21/67766* (2013.01); *H01L 21/67775* (2013.01); *H01L 21/67778* (2013.01)

(58) Field of Classification Search
CPC ......... H01L 21/67017; H01L 21/67196; H01L 21/67766; H01L 21/67775; H01L 21/67778
See application file for complete search history.

(56) References Cited

U.S. PATENT DOCUMENTS 6,224,679 B1    5/2001   Sasaki et al.
2004/0105738 A1    6/2004   Ahn et al.
(Continued)

FOREIGN PATENT DOCUMENTS

JP    H11-063604    3/1999
JP    2004-200669 A    7/2004
(Continued)

OTHER PUBLICATIONS

International Search Report dated Aug. 2, 2016.

*Primary Examiner* — Saul Rodriguez
*Assistant Examiner* — Ashley K Romano
(74) *Attorney, Agent, or Firm* — Fenwick & West LLP

(57) ABSTRACT

A compartment variable device is provided with: a baffle plate which has a plurality of openings and which as a whole has a rectangular shape; a rectangular frame disposed around the baffle plate; a bellows connected to a bottom of the frame; and a bellows support portion to which the lower end of the bellows is fixed. When a transfer arm of an atmosphere-side transfer device is lifted, the frame of the compartment variable device which is engaged with the transfer arm is lifted, thereby extending the bellows. Accordingly, the volume of a gas flow space in an atmospheric pressure transfer chamber is decreased, allowing the atmosphere in the gas flow space in the atmospheric pressure transfer chamber to be replaced in a short time.

12 Claims, 8 Drawing Sheets

(56) References Cited

U.S. PATENT DOCUMENTS

| | | | |
|---|---|---|---|
| 2006/0169207 A1* | 8/2006 | Kobayashi | C23C 16/4401 |
| | | | 118/715 |
| 2007/0115446 A1 | 5/2007 | Nishimura | |
| 2009/0000543 A1* | 1/2009 | Fukutomi | H01L 21/6715 |
| | | | 118/58 |
| 2010/0068014 A1* | 3/2010 | Mitsuyoshi | B65G 49/061 |
| | | | 414/225.01 |
| 2010/0221895 A1* | 9/2010 | Seino | H01J 37/32091 |
| | | | 438/478 |
| 2014/0199140 A1* | 7/2014 | Matsumoto | H01L 21/67259 |
| | | | 414/222.07 |
| 2018/0151336 A1* | 5/2018 | Sakka | H01J 37/32899 |

FOREIGN PATENT DOCUMENTS

| | | |
|---|---|---|
| JP | 2004-311940 | 11/2004 |
| JP | 2005-333076 | 12/2005 |
| JP | 2007-142337 A | 6/2007 |

\* cited by examiner

SUBSTRATE TRANSFER CHAMBER, SUBSTRATE PROCESSING SYSTEM, AND METHOD FOR REPLACING GAS IN SUBSTRATE TRANSFER CHAMBER

FIELD OF THE INVENTION

The present invention relates to a substrate transfer chamber for transferring a substrate, e.g., a semiconductor wafer or the like, a substrate processing system including the substrate transfer chamber, and a method for replacing a gas in the substrate transfer chamber.

BACKGROUND OF THE INVENTION

In manufacturing a semiconductor device, a substrate processing system including a plurality of processing chambers is used to perform various processes on a substrate to be processed such as a semiconductor wafer or the like. Generally, the substrate processing system includes: a mounting unit for mounting thereon a FOUP (Front Opening Unified Pod) as a transfer container accommodating therein several tens of substrates; a processing unit for performing predetermined processing on a substrate; and a substrate transfer chamber provided between the mounting unit and the processing unit.

A fan filter unit (FFU) for supplying clean air or a clean gas, e.g., $N_2$ gas or the like, into the substrate transfer chamber, is provided at a ceiling portion of the transfer chamber. In the substrate transfer chamber, a highly clean environment without particles can be maintained by forming downward flow by the clean gas and by increasing an internal pressure to protect the substrate from particle contamination (e.g., Japanese Patent Application Publication No. H11-63604 (Patent Document 1) and Japanese Patent Application Publication No. 2004-311940 (Patent Document 2)).

An operator may enter the substrate transfer chamber during a maintenance operation or the like. Therefore, a gas in the substrate transfer chamber needs to be replaced before and after the maintenance operation. For example, it is required to replace $N_2$ gas in the substrate transfer chamber with clean air before the maintenance operation and replace the clean air in the substrate transfer chamber with $N_2$ gas after the maintenance operation. It is preferable to set the gas replacement time to be considerably short in order to reduce a period of time in which the entire substrate processing system is stopped. When the clean air is replaced with $N_2$ gas, a large amount of $N_2$ gas is required until the substrate transfer chamber is filled with $N_2$ gas and, thus, reduction of the amount of $N_2$ gas is also required.

There is suggested a technique for improving a throughput of a pressure switching operation by providing a volume varying mechanism for varying a volume in a load-lock chamber which is switched between a vacuum state and an atmospheric pressure state in a substrate processing system (e.g., Japanese Patent Application Publication No. 2005-333076 (Patent Document 3)). The volume varying mechanism has a single-purpose actuator to move a movable plate.

SUMMARY OF THE INVENTION

In accordance with an aspect, there is provided a substrate transfer chamber where a transfer unit for transferring a substrate is provided, including: a gas supply unit configured to supply a gas into the substrate transfer chamber; a gas exhaust unit configured to exhaust a gas in the substrate transfer chamber; and a compartment variable device configured to vary compartment of a gas flow space in the substrate transfer chamber in cooperation with the transfer unit.

In the substrate transfer chamber, the transfer unit may be vertically movable, and the compartment variable device may vary the compartment of the gas flow space in the substrate transfer chamber by the vertical movement of the transfer unit. In this case, the compartment variable device may include: a movable member which is movable vertically in the substrate transfer chamber; and an extensible and contractible member which is extended and contracted by movement of the movable member. Further, the movable member may be a rectifying plate having a plurality of openings and configured to rectify gas flow.

In the substrate transfer chamber, a connecting mechanism for connecting the compartment variable device and the transfer unit may be provided at one or both of the compartment variable device and the transfer unit.

In the substrate transfer chamber, the connecting mechanism may be a mechanical mechanism, a suction mechanism or an electrical attracting mechanism.

In accordance with another aspect, there is provided a substrate processing system including: a mounting unit configured to mount a transfer container accommodating a plurality of substrates; a processing unit configured to perform predetermined processing on the substrates; and a substrate transfer chamber provided between the mounting unit and the processing unit. In the substrate processing system, the substrate transfer chamber may include: a transfer unit configured to transfer the substrates between the transfer container mounted on the mounting unit and the processing unit; a gas supply unit configured to supply a gas into the substrate transfer chamber; a gas exhaust unit configured to exhaust a gas in the substrate transfer chamber; and a compartment variable device configured to vary compartment of a gas flow space in the substrate transfer chamber in cooperation with the transfer unit.

In accordance with still another aspect, there is provided a method for replacing a gas in a substrate transfer chamber for transferring a substrate. In the gas replacement method, the substrate transfer chamber includes a transfer unit configured to transfer the substrate, a gas supply unit configured to supply a gas into the substrate transfer chamber, a gas exhaust unit configured to exhaust a gas in the substrate transfer chamber, and a compartment variable device configured to vary compartment of a gas flow space in the substrate transfer chamber in cooperation with the transfer unit. The gas replacement method includes: a first step of decreasing a volume of the gas flow space by the compartment variable device in a first exhaust state in which a large amount of gas is exhausted through the gas exhaust unit; and a second step of increasing a volume of the gas flow space by the compartment variable device in a second exhaust state in which a relatively small amount of gas is exhausted through the gas exhaust unit.

In the gas replacement method, the first step may be performed in a first supply state in which a small amount of gas is supplied from the gas supply unit is obtained, and the second step may be performed in a second supply state in which a relatively large amount of gas is supplied from the gas supply unit is obtained.

In the gas replacement method, the transfer unit may be vertically movable. Further, the compartment variable device may be configured to vary the compartment of the gas flow space in the substrate transfer chamber by the vertical movement of the transfer unit to decrease the volume of the gas flow space in a state where the transfer unit is lifted and increase the volume of the gas flow space in a state where the transfer unit is lowered.

DETAILED DESCRIPTION OF THE EMBODIMENTS

Hereinafter, embodiments will be described in detail with reference to the accompanying drawings.

(Configuration of Substrate Processing System)

Figure 1:
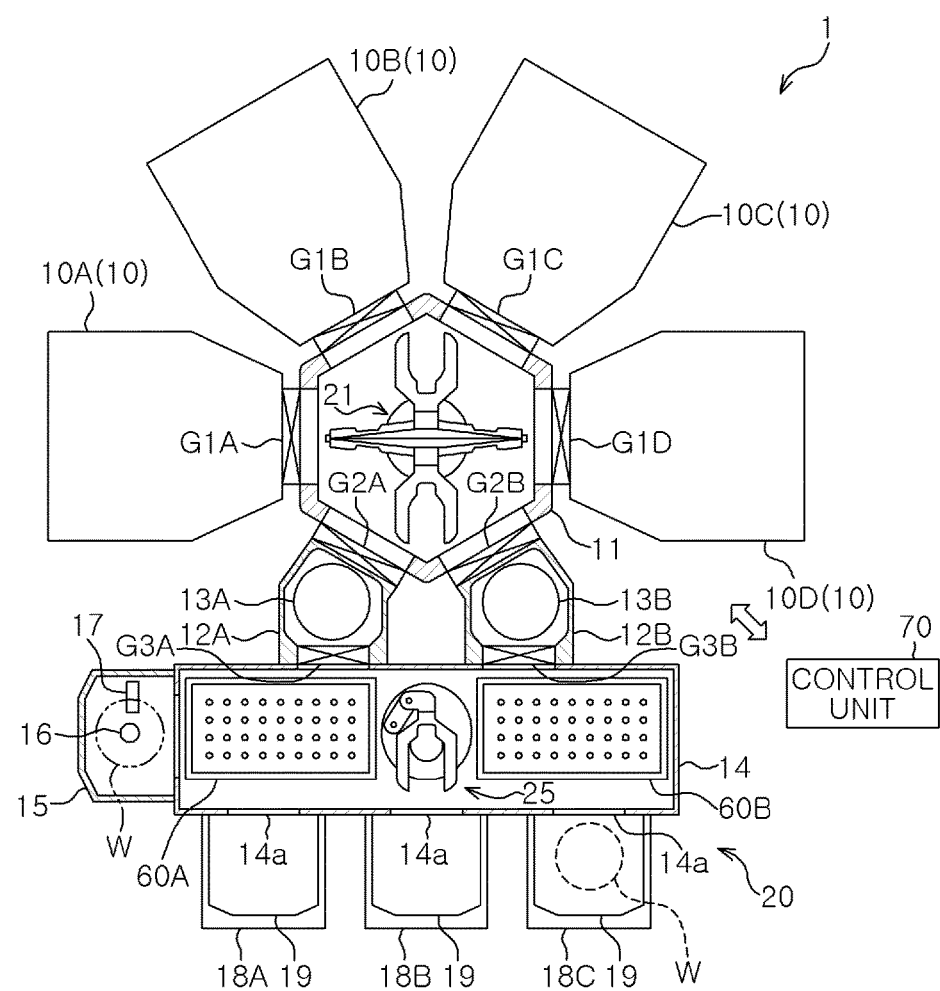
FIG. 1 is a top view showing a schematic configuration of a substrate processing system according to an embodiment.
Figure 2:
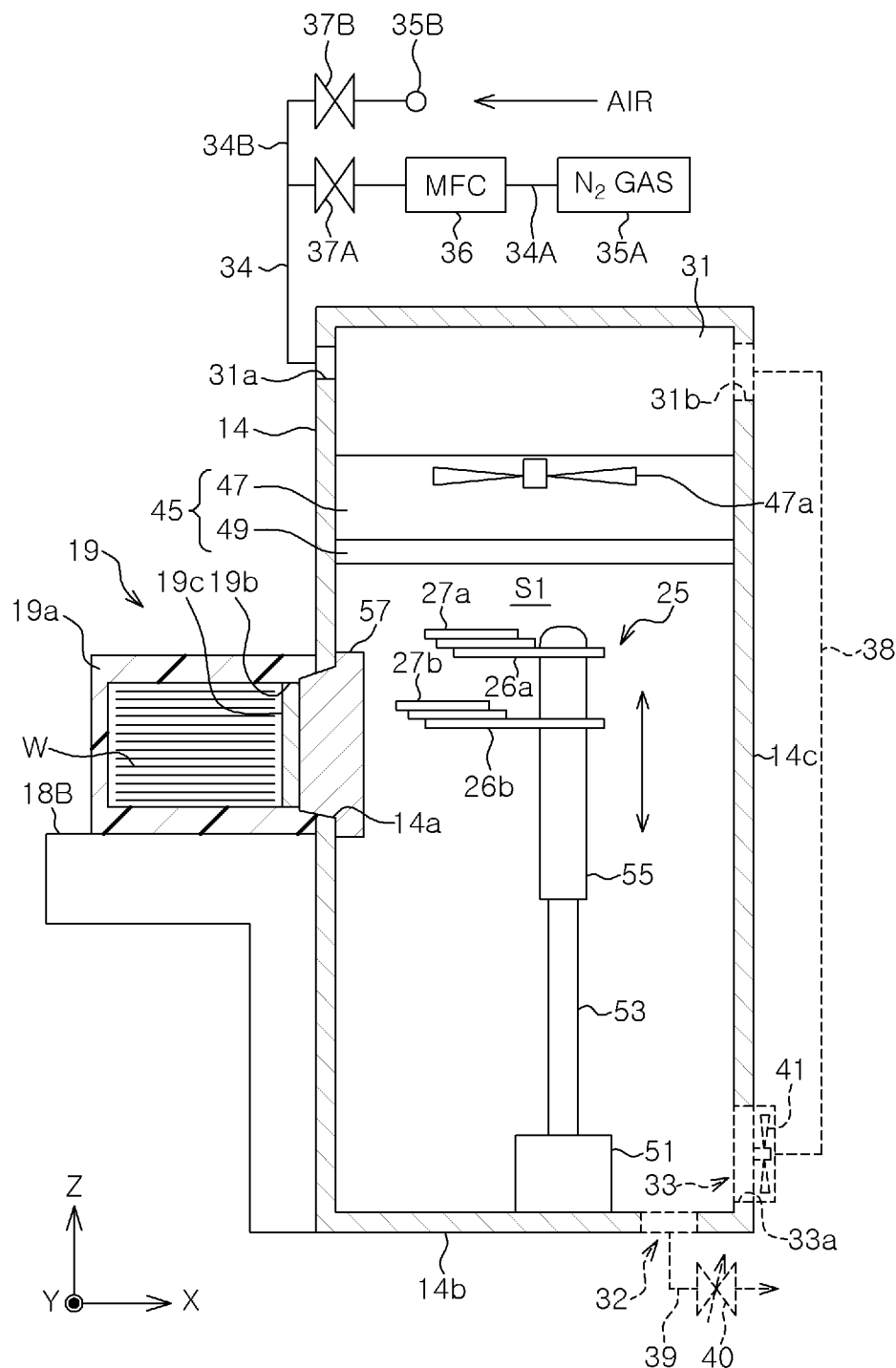
FIG. 2 explains a schematic configuration of an atmospheric pressure transfer chamber.

First, a configuration of a substrate processing system according to an embodiment will be described with reference to FIGS. 1 and 2. FIG. 1 is a top view showing a schematic configuration of the substrate processing system according to an embodiment. FIG. 2 explains a schematic configuration of an atmospheric pressure transfer chamber in the substrate processing system shown in FIG. 1. FIG. 2 is a cross sectional view showing an inside of the atmospheric pressure transfer chamber and a part of load ports.

The substrate processing system 1 performs predetermined processing such as film formation, diffusion, etching and the like, on, e.g., a semiconductor wafer for manufacturing a semiconductor device (hereinafter, referred to as "wafer") W, through a series of operations.

(Process Module)

The substrate processing system 1 includes a plurality of process modules for performing predetermined processing on the wafer W. The substrate processing system 1 of the present embodiment includes four process modules 10A to 10D. Each of the process modules 10A to 10D has a processing chamber whose inner space can be maintained in a predetermined depressurized atmosphere (vacuum state).

(Vacuum Transfer Chamber)

The substrate processing system 1 further includes a vacuum transfer chamber 11. An inner space of the vacuum transfer chamber 11 can be maintained in a predetermined depressurized atmosphere, as in the case of the processing chambers of the process modules 10A to 10D. The vacuum transfer chamber 11 includes a vacuum-side transfer device 21. The vacuum-side transfer device 21 transfers the wafer W between the processing chambers of the process modules 10A to 10D and load-lock chambers 12A and 12B to be described below.

(Load-lock Chambers)

The substrate processing system 1 further includes two load-lock chambers 12A and 12B. The process modules 10A to 10D and the load-lock chambers 12A and 12B are adjacent to the vacuum transfer chamber 11. The load-lock chambers 12A and 12B can be switched between an atmospheric pressure state and a vacuum state. A substrate mounting table 13A for mounting thereon a wafer W is provided in the load-lock chamber 12A. A substrate mounting table 13B for mounting thereon a wafer W is provided in the load-lock chamber 12B.

(Loader Module)

The substrate processing system 1 further includes a loader module 20 for loading/unloading a wafer W into/from the substrate processing system 1. The loader module 20 includes an atmospheric pressure transfer chamber 14 serving as a substrate transfer chamber, an orienter 15 for aligning a position of the wafer W, and a plurality of load ports 18A to 18C.

(Atmospheric Pressure Transfer Chamber)

A horizontal cross section of the atmospheric pressure transfer chamber 14 has a rectangular shape elongated in one direction (left-right direction in FIG. 1). The load-lock chambers 12A and 12B are provided between the atmospheric pressure transfer chamber 14 and the vacuum transfer chamber 11. One side surface of the atmospheric pressure transfer chamber 14 is adjacent to the load-lock chambers 12A and 12B.

(Orienter)

The orienter 15 is connected to one longitudinal end portion of the atmospheric pressure transfer chamber 14. The orienter 15 includes a rotary plate 16 rotated by a driving motor (not shown) and an optical sensor 17 provided at a position corresponding to an outer periphery of the rotary plate 16 to detect a peripheral portion of the wafer W.

(Load Port)

In the example shown in FIG. 1, the substrate processing system 1 includes three load ports 18A to 18C. The load ports 18A to 18C are adjacent to port openings 14a formed at a side of the atmospheric pressure transfer chamber 14 which is opposite to the side adjacent to the load-lock chambers 12A and 12B. FOUPs 19 as transfer containers of wafers W can be mounted on the respective load ports 18A to 18C. Each of the FOUPs 19 accommodates therein wafers W vertically arranged in multiple stages at a predetermined interval.

As shown in FIG. 2, each of the FOUPs 19 mounted on the load ports 18A to 18C includes a main body 19a, an opening 19b formed at the main body 19a, and a detachable FOUP door 19c for closing the opening 19b. The FOUP door 19c of the FOUP 19 is held by a port door 57. The port door 57 forms a part of an FOUP opener (not shown) and detachably holds the FOUP door 19c by a driving unit (not shown). Further, the port door 57 moves back and forth in the X direction in FIG. 2. The port door 57 moves forward and holds the FOUP door 19c closing the opening 19b of the FOUP 19. Then, the port door 57 moves backward while supporting the FOUP door 19c to open the opening 19b of the FOUP 19. Then, the port door 57 moves forward while supporting the FOUP door 19c to attach the FOUP door 19c to the opening 19b of the FOUP 19. Next, the port door 57 separated from the FOUP door 19c moves backward. Accordingly, the opening 19b of the FOUP 19 is closed by the FOUP door 19c.

(Atmosphere-side Transfer Device)

The substrate processing system 1 further includes an atmosphere-side transfer device 25 provided in the atmospheric pressure transfer chamber 14. The atmosphere-side transfer device 25 transfers the wafer W between the FOUPs 19 of the load ports 18A to 18C, the load-lock chambers 12A and 12B, and the orienter 15.

As shown in FIG. 2, the atmosphere-side transfer device 25 includes a pair of transfer arms 26a and 26b vertically arranged in two stages, a fork 27a provided at a leading end of the transfer arm 26a, and a fork 27b provided at a leading end of the transfer arm 26b. The forks 27a and 27b serve as holding members for mounting and holding wafers W thereon. The atmosphere-side transfer device 25 transfers wafers W held on the forks 27a and 27b. The transfer arms 26a and 26b can rotate and extend/contract in a horizontal direction (X-axis direction and Y-axis direction in FIG. 2). Base ends of the transfer arms 26a and 26b of the atmosphere-side transfer device 25 are connected to an elevation unit 55 moving vertically along a column 53 extending upwardly from a base portion 51 of the atmosphere-side transfer device 25. Accordingly, the transfer arms 26a and 26b can be raised and lowered in a vertical direction (Z-axis direction in FIG. 2).

(Gas Supply/Exhaust/Circulation Equipment)

The atmospheric pressure transfer chamber 14 has a gas supply/exhaust/circulation equipment for supplying, e.g., $N_2$ gas or clean air to flow downward into a gas flow space S1. Specifically, the atmospheric pressure transfer chamber 14 includes a gas introducing part 31 provided at an upper portion thereof, a gas exhaust part 32 and a gas circulation part 33 provided at a lower portion thereof, and a FFU (Fan Filter Unit) 45 provided adjacent to the gas introducing part 31.

The gas introducing part 31 introduces external air or a clean gas such as $N_2$ gas or the like through a gas inlet port 31a. For example, a line 34 connected to the gas inlet port 31a is also connected to an $N_2$ gas supply source 35A or an air inlet port 35B. The $N_2$ gas supply source 35A is connected to a line 34A branched from the line 34. A mass flow controller 36 and an opening/closing valve 37A which are used for flow rate control are provided in the line 34A. The air inlet port 35B is connected to a line 34B branched from the line 34. An opening/closing valve 37B is provided in the line 34B.

A circulation gas inlet port 31b is connected to a circulation line 38 from the gas circulation part 33.

The gas exhaust part 32 is connected to a gas exhaust line 39. The gas exhaust part 32 can exhaust a gas to the outside of the atmospheric pressure transfer chamber 14 at a flow rate controlled by a flow rate variable valve 40.

A gas exhaust port 33a of the gas circulation part 33 is connected to the circulation line 38. The gas circulation part 33 has an exhaust fan 41. The exhaust fan 41 circulates a gas in the atmospheric pressure transfer chamber 14 from the gas exhaust port 33a of the gas circulation part 33 to the circulation gas inlet port 31b of the gas introducing part 31 through the circulation line 38. By providing the gas circulation mechanism, the amount of $N_2$ gas or the like used in the atmospheric pressure transfer chamber 14 can be reduced.

The FFU 45 includes a fan unit 47 and a filter unit 49 disposed in that order from the top. The fan unit 47 has a fan 47a for blowing a gas downward. The filter unit 49 collects dust in the gas passing through the fan unit 47. The FFU 45 generates downward flow of a gas introduced into the atmospheric pressure transfer chamber 14 through the gas introducing part 31 to be exhausted through the gas exhaust part 32 or the gas circulation part 33 via the gas flow space S1 where the atmosphere-side transfer device 25 is provided. Further, the FFU 45 collects and removes dust in the gas. Accordingly, the inner space of the atmospheric pressure transfer chamber 14 is maintained in a clean state.

(Compartment Variable Device)

The substrate processing system 1 further includes a compartment variable device 60 for varying compartment of the gas flow space in the atmospheric pressure transfer chamber 14 in cooperation with the atmosphere-side transfer device 25. In the present embodiment, two compartment variable devices 60A and 60B are provided as shown in FIG. 1. The compartment variable device 60A is provided at a right side of the atmosphere-side transfer device 25 provided substantially at the center of the atmospheric pressure transfer chamber 14 when viewed toward the load ports 18A to 18C. The compartment variable device 60B is provided at a left side of the atmosphere-side transfer device 25 when viewed toward the load ports 18A to 18C. When it is not necessary to distinguish the two compartment variable devices 60A and 60B, they may be referred to as "compartment variable device 60". The compartment variable device 60 will be described in detail later.

(Gate Valve)

The substrate processing system 1 further includes gate valves G1A, G1B, G1C, G1D, G2A and G2B. The gate valves G1A to G1D are provided between the vacuum transfer chamber 11 and the process modules 10A to 10D, respectively. The gate valves G2A and G2B are provided between the vacuum transfer chamber 11 and the load-lock chambers 12A and 12B, respectively. The substrate processing system 1 further includes gate valves G3A and G3B. The gate valves G3A and G3B are provided between the load-lock chambers 12A and 12B and the atmospheric pressure transfer chamber 14, respectively. Each of the gate valves has a function of opening/closing an opening formed at a wall for partitioning two adjacent spaces.

(Mounting Unit, Processing Unit and Substrate Transfer Chamber)

In the substrate processing system 1, the load ports 18A to 18C serve as mounting units for mounting thereon FOUPs 19 that are transfer containers accommodating therein a plurality of wafers W. The four process modules 10A to 10D, the vacuum transfer chamber 11, and the two load-lock chambers 12A and 12B constitute the processing unit for performing predetermined processing on a wafer W. The atmospheric pressure transfer chamber 14 serves as the substrate transfer chamber disposed between the mounting unit and the processing unit. The vacuum transfer chamber and the load-lock chambers 12A and 12B are not necessarily required in the processing unit and thus may not be included in the processing unit.

(Control Unit)

A control unit 70 controls the operations of the respective components of the substrate processing system 1. In other words, the control unit 70 controls the entire substrate processing system 1 or controls the respective components (end devices) such as the process module 10, the vacuum transfer chamber 11, the load-lock chambers 12A and 12B, the loader module 20 and the like.

Figure 3:
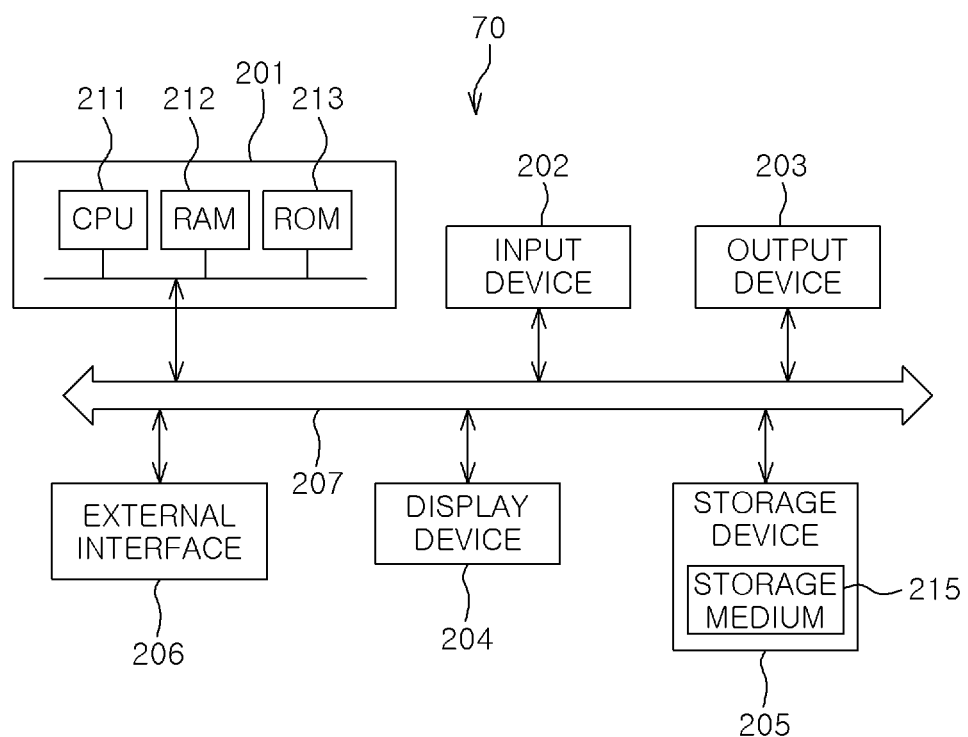
FIG. 3 explains an example of a hardware configuration of a control unit in the substrate processing system.

The control unit 70 is typically a computer. FIG. 3 shows an example of a hardware configuration of the control unit 70. The control unit 70 includes a main controller 201, an input device 202 such as a keyboard, a mouse or the like, an output device 203 such as a printer or the like, a display device 204, a storage device 205, an external interface 206, and a bus 207 for connecting these devices. The main controller 201 has a CPU (central processing unit) 211, a RAM (random access memory) 212 and a ROM (read only memory) 213. The storage device 205 is not particularly limited as long as information can be stored. For example, the storage device 205 is a hard disk device or an optical disk device. Further, the storage unit 105 stores information in a computer-readable storage medium 215 and reads out the information from the storage medium 215. The storage medium 215 is not particularly limited as long as information can be stored. For example, the storage medium 215 is a hard disk, an optical disk, a flash memory or the like. The storage medium 215 may store therein various processes performed in the process modules 10A to 10D of the substrate processing system 1 or recipes of a method for replacing a gas in the atmospheric pressure transfer chamber 14.

For example, the control unit 70 controls the substrate processing system 1 to perform the method for replacing a gas in the atmospheric pressure transfer chamber 14. In that case, the control unit 70 controls the components (e.g., the atmosphere-side transfer device 25, the mass flow controller 36, the opening/closing valves 37A and 37B, the flow rate variable valve 40, the FFU 45, the compartment variable device 60 and the like) which are related to the gas replacement method in the substrate processing system 1. The gas replacement method is realized by the CPU 211 executing software (program) stored in the ROM 213 or in the storage device 205 while using the RAM 212 as a work area.

(Specific Structure of the Compartment Variable Device)

Figure 4:
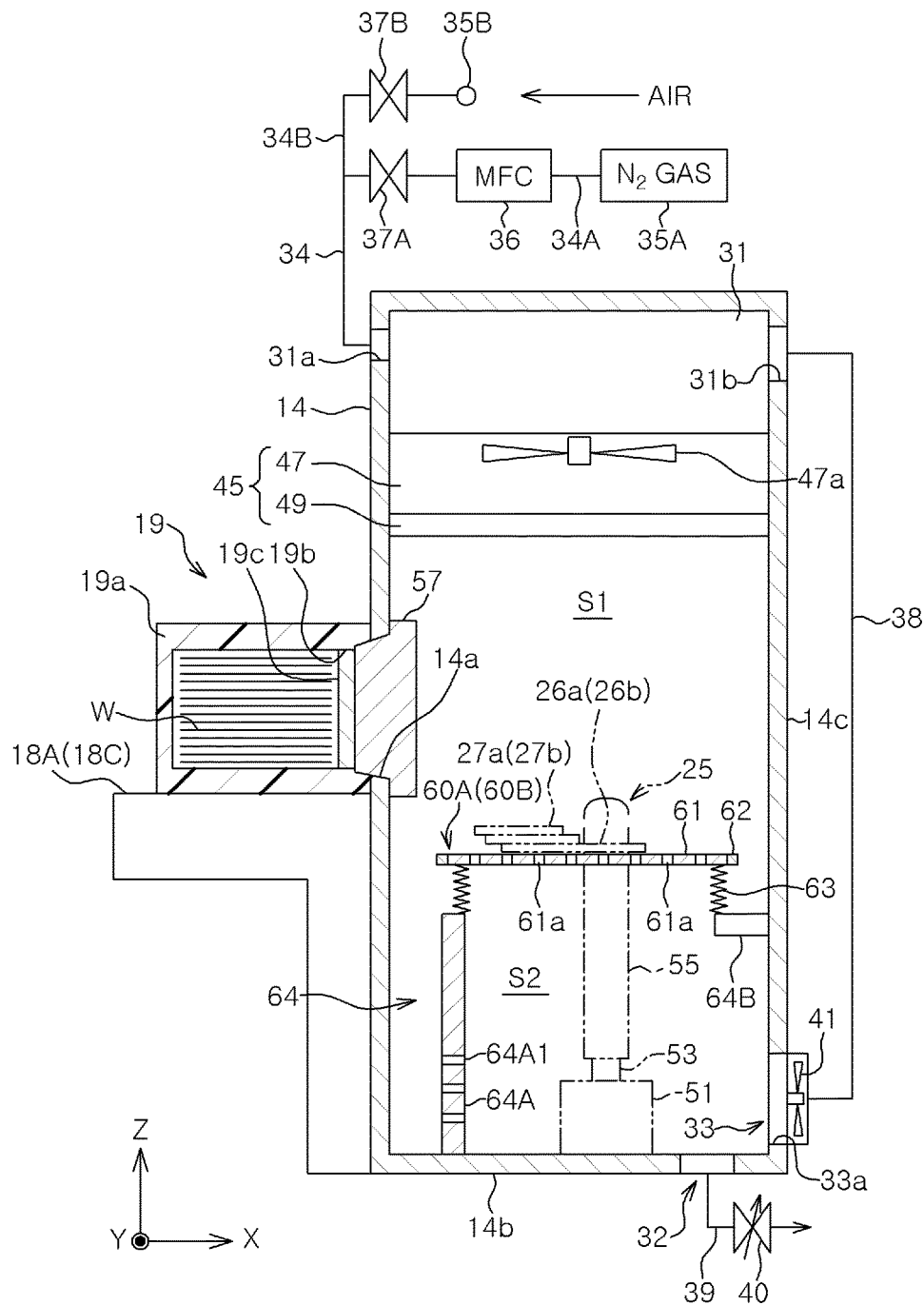
FIG. 4 explains an operation of a compartment variable device in the substrate processing system shown in FIG. 1.
Figure 5:
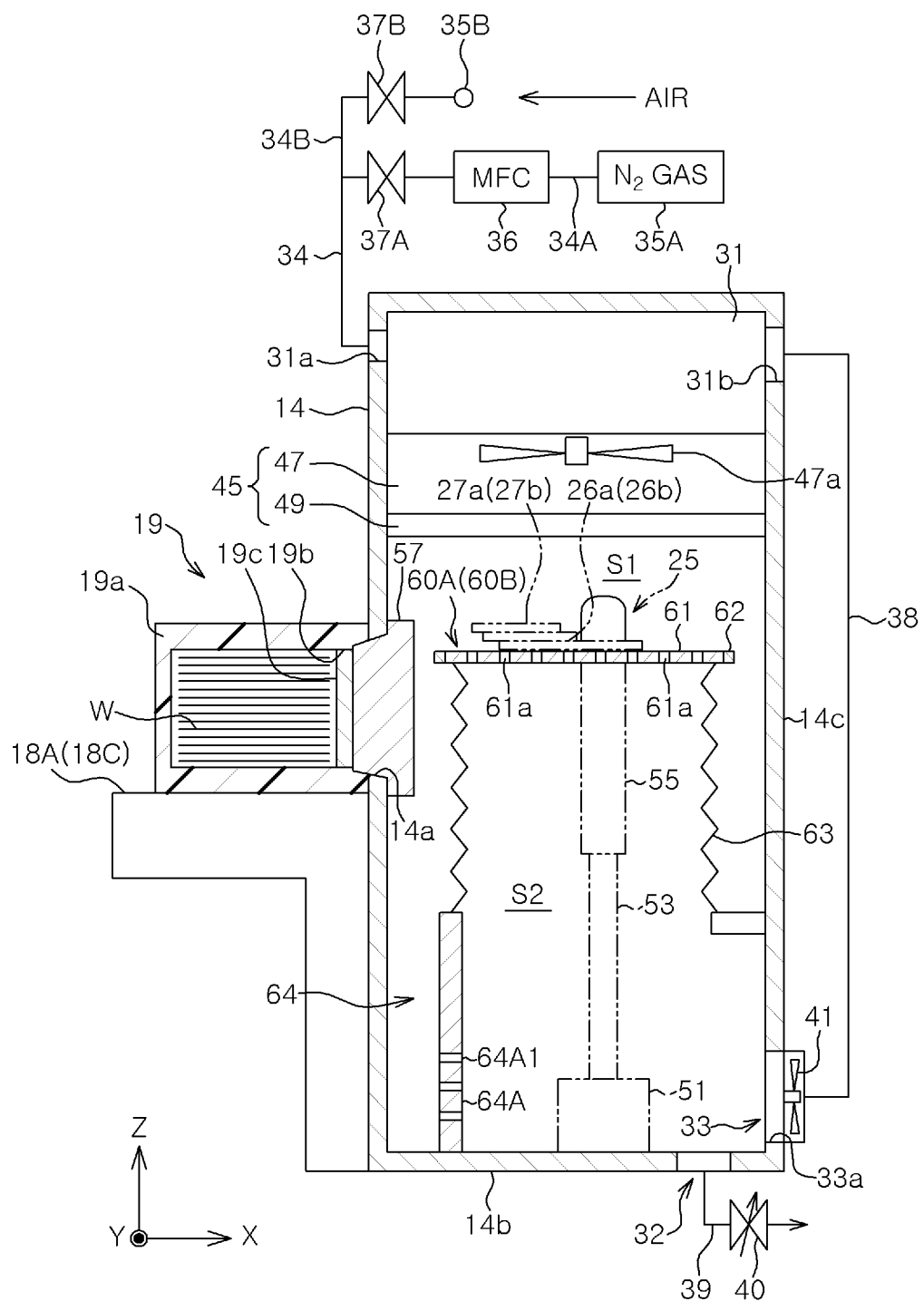
FIG. 5 explains an operation of the compartment variable device which is continued from the operation shown in FIG. 4.

The compartment variable device 60 will be further described in detail with reference to FIGS. 2, 4 and 5. FIGS. 4 and 5 are views for explaining the compartment variable device 60 and the operation thereof.

The compartment variable device 60 includes a rectangular baffle plate 61 having a plurality of openings, a rectangular frame 62 surrounding the baffle plate 61, a bellows 63 connected to a bottom of the frame 62, and a bellows support portion 64 to which a lower end of the bellows 63 is fixed. The baffle plate 61 and the bellows 63 may be directly connected to each other. In that case, the frame 62 may be omitted.

(Baffle Plate)

The baffle plate 61, which is a moving member movable vertically in the atmospheric pressure transfer chamber 14 has a plurality of openings 61a. The baffle plate 61 serves as a rectifying plate for controlling gas flow in the atmospheric pressure transfer chamber 14 by allowing a gas to pass through the openings 61a. The baffle plate 61 may be made of a metal, e.g., SUS, aluminum or the like, or synthetic resin or the like. As will be described later, the size of the gas flow space S1 can be varied by vertically moving the baffle plate 61. When the frame 62 is not provided, a connecting mechanism to be coupled to the atmosphere-side transfer device 25 may be provided at the baffle plate 61.

(Frame)

The frame 62 is a case made of a metal, e.g., SUS, aluminum or the like. The baffle plate 61 and the bellows 63 are connected by the frame 62. In the present embodiment, a connecting mechanism to be connected with the atmosphere-side transfer device 25 is provided at the frame 62. The connecting mechanism is not necessarily provided at the frame 62. The connecting mechanism may be provided at the transfer arms 26a and 26b or may be provided at both of the frame 62 and the transfer arms 26a and 26b. The connecting mechanism will be described later.

(Bellows)

The bellows 63 is an extensible/contractible structure made of a metal such as SUS or the like, or synthetic resin or elastomer. The bellows 63 is vertically extended and contracted in the atmospheric pressure transfer chamber 14 by the vertical movement of the baffle plate 61 and the frame 62. The bellows 63 has a square tube shape in accordance with the shape of the baffle plate 61 and that of the frame 62.

(Bellows Supporting Portion)

The bellows support portion 64 includes a wall member 64A extending upwardly from a bottom wall 14b of the atmospheric pressure transfer chamber 14 and a bracket member 64B protruding horizontally from a sidewall 14c of the atmospheric pressure transfer chamber 14. A plurality of through-holes 64A1 is formed at the wall member 64A. The wall member 64A has a function of rectifying a gas generated by the FFU 45.

The shape of the baffle plate 61 and that of the frame 62 are not limited to a rectangular shape and the shape of the bellows 63 is not limited to a square column shape. The shapes thereof may be appropriately set depending on the shape of the atmospheric pressure transfer chamber 14, the arrangement of the atmosphere-side transfer device 25 or the like.

(Operation of the Compartment Variable Device)

FIG. 4 shows a state in which the transfer arm 26a of the atmosphere-side transfer device 25 is lowered in the Z-axis direction and coupled to the frame 62 of the compartment variable device 60. In the state shown in FIG. 4, the volume of the gas flow space S1 in the atmospheric pressure transfer chamber 14 is greater than that in the state shown in FIG. 5 which will be descried later. Here, a space defined by the baffle plate 61 and the bellows 63 is a gas exhaust space S2. The gas exhaust space S2 directly communicates with the gas exhaust part 32 and the gas circulation part 33. The gas flow space S1 communicates with the gas exhaust part 32 and the gas circulation part 33 through the openings 61a of the baffle plate 61 or the through-holes 64A1 of the bellows support portion 64. Therefore, a pressure loss occur when the gas passes through the openings 61a of the baffle plate 61 or the through-holes 64A1 of the bellows support portion 64, which leads to a pressure difference between the gas flow space S1 and the gas exhaust space S2. Accordingly, the gas exhaust space S2 is distinguished from the gas flow space S1 maintained in a clean state by flowing clean air or clean gas in the atmospheric pressure transfer chamber 14.

FIG. 5 shows a state in which the bellows 63 is extended by lifting the transfer arm 26a of the atmosphere-side transfer device 25 and also lifting the frame 62 of the compartment variable device 60 which is coupled to the transfer arm 26a from the state shown in FIG. 4. In the state shown in FIG. 5, the volume of the gas exhaust space S2 defined by the baffle plate 61 and the bellows 63 is increased and the volume of the gas flow space S1 in the atmospheric pressure transfer chamber 14 is relatively decreased compared to the state shown in FIG. 4. The compartment variable device 60 has a function of varying compartment of the gas flow space S1 and the gas exhaust space S2 in the atmospheric pressure transfer chamber 14 or varying the volumes of the gas flow space S1 and the gas exhaust space S2. Therefore, in the case of replacing clean gas with clean air or replacing clean air with clean gas, the compartment variable device 60 is temporarily maintained in the state shown in FIG. 5 in which the volume of the gas flow space S1 is smaller than that in the state shown in FIG. 4. Accordingly, it is possible to replace an atmosphere of the gas flow space S1 in the atmospheric pressure transfer chamber 14 in a short period of time.

(Connecting Mechanism)

Figure 6:
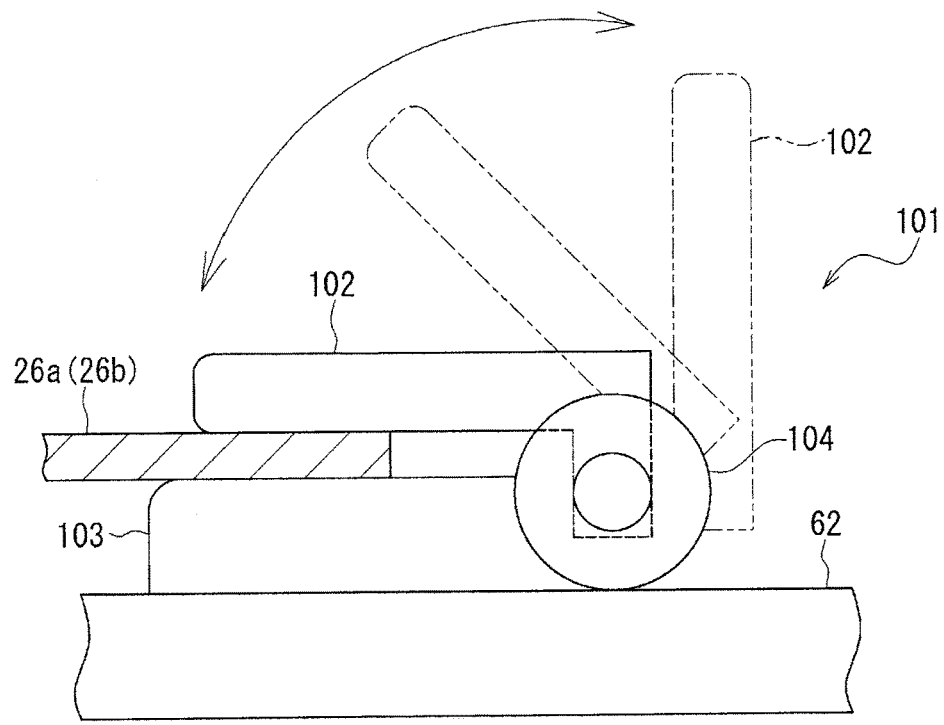
FIG. 6 explains an example of a connecting structure of the compartment variable device and an atmospheric-side transfer device.
Figure 7:
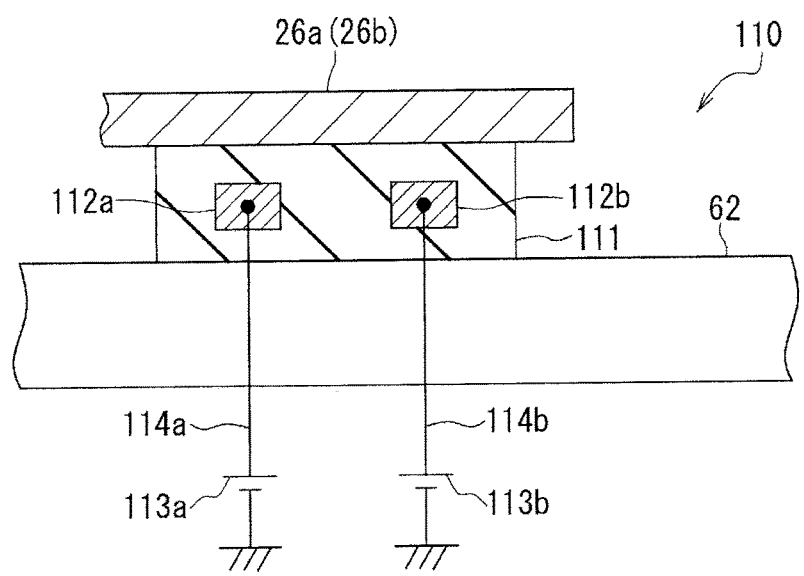
FIG. 7 explains another example of the connecting structure of the compartment variable device and the atmospheric-side transfer device.
Figure 8:
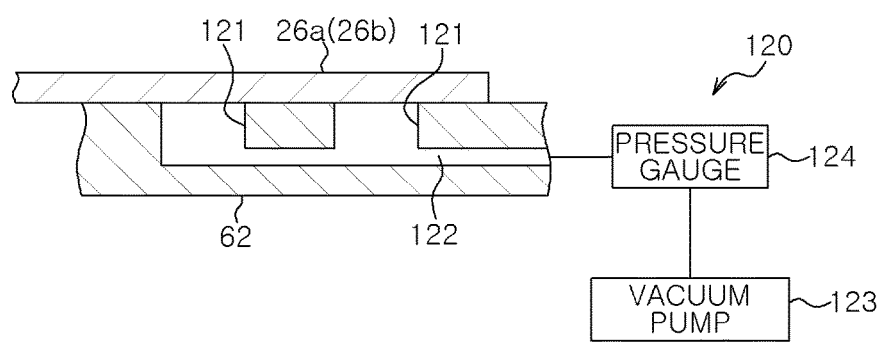
FIG. 8 explains still another example of the connecting structure of the compartment variable device and the atmospheric-side transfer device.

The connecting mechanism for connecting the compartment variable device 60 and the atmosphere-side transfer device 25 is not particularly limited and may have any configuration as long as a connected state and a separated state can be switched. For example, the connecting mechanism may be a mechanical mechanism such as a clamp, a hook or the like, an electrical attracting mechanism such as an electrostatic chuck, an electromagnetic chuck or the like, or a suction mechanism using a pressure, such as a vacuum chuck or the like. FIGS. 6 to 8 show representative examples of the connecting mechanism.

As shown in FIG. 6, the connecting mechanism may be a mechanical clamp mechanism for clamping the transfer arm 26a or 26b of the atmosphere-side transfer device 25. A clamp device 101 shown in FIG. 6 is installed on a top surface of the frame 62 of the compartment variable device 60. The clamp device 101 includes an upper and a lower contacting member 102 and 103, a rotatable shaft 104 for changing a distance between the contacting members 102 and 103, and a driving unit (not shown), e.g., a motor or the like, for driving the shaft 104. The contacting member 102 is connected to the shaft 104. In the clamp device 101, by rotating the shaft 104 by the driving unit (not shown), the upper contacting member 102 having an L-shaped cross section can be rotated in a direction indicated by an arrow shown in FIG. 6.

In order to couple the frame 62 of the compartment variable device 60 to the transfer arm 26a or 26b of the atmosphere-side transfer device 25 by the clamp device 101, first, the transfer arm 26a or 26b of the atmosphere-side transfer device 25 is moved to a position on the lower contacting member 103. Then, a part (or all) of the bottom surface of the transfer arm 26a or 26b is made to be in contact with the top surface of the lower contacting member 103. In that state, the upper contacting member 102 is rotated by rotating the shaft 104. Accordingly, the transfer arm 26a or 26b can be clamped between the contacting members 102 and 103. By rotating the shaft 104 in a reverse direction, the contacting member 102 is rotated and the distance to the contacting member 103 is increased. Accordingly, the clamping of the transfer arm 26a or 26b is released.

As shown in FIG. 7, the connecting mechanism may be an electrostatic chuck mechanism for attracting and holding the transfer arm 26a or 26b of the atmosphere-side transfer device 25 by an electrostatic force represented by a Coulomb force. An electrostatic chuck 110 shown in FIG. 7 includes an attraction base 111 made of a dielectric material, a first electrode 112a and a second electrode 112b buried in the attraction base 111, DC power supplies 113a and 113b for applying DC voltages to the first electrode 112a and the second electrode 112b, respectively. The DC power supply 113a and the first electrode 112a are electrically connected by a power feed line 114a. The DC power supply 113b and the second electrode 112b are connected by a power feed line 114b. A part (or all) of the transfer arm 26a or 26b can be attracted and held on the electrostatic chuck 110 by, e.g., the Coulomb force, by applying DC voltages to the first and the second electrode 112a and 112b in a state where the transfer arm 26a or 26b is moved to a position on the attraction base 111. The electrostatic chuck 110 can release the attraction of the transfer arm 26a or 26b by stopping the voltage application from the DC power supplies 113a and 113b to the first and the second electrode 112a and 112b. In FIG. 7, the bipolar electrostatic chuck 110 having a pair of electrodes 112a and 112b is illustrated as an example. However, a unipolar electrostatic chuck mechanism may be used.

As shown in FIG. 8, the connecting mechanism may be a vacuum chuck mechanism for vacuum-attracting the transfer arm 26a or 26b of the atmosphere-side transfer device 25. FIG. 8 shows a cross section of the frame 62 having a vacuum chuck 120. The vacuum chuck 120 includes a plurality of suction grooves 121 formed in the frame 62, an intake passage 122 communicating with the suction grooves 121, and a vacuum pump 123 connected to an end portion of the intake passage 122.

When the vacuum pump 123 is driven in a state where the bottom surface of the transfer arm 26a or 26b is made to be in contact with a region (attraction region) of the frame where the suction grooves 121 are formed, the inner spaces of the suction grooves 121 are maintained in a depressurized state. In other words, the inner spaces of the suction grooves 121 are airtightly sealed by the transfer arm 26a or 26b and maintained in a vacuum state. Accordingly, the transfer arm 26a or 26b is attracted to the frame 62. By stopping the operation of the vacuum pump 123 and opening a valve (not shown), a pressure in the suction grooves 121 and the intake passage 122 is increased to an atmospheric pressure and, thus, the attraction of the transfer arm 26a or 26b to the frame 62 is released.

A pressure gauge 124 may be provided in the intake passage 122. By measuring a pressure in the intake passage 122 using the pressure gauge 124, it is possible to determine whether or not leakage in which external air enters the suction grooves 121 occurs. When there is no leakage, it is determined that the transfer arm 26a or 26b is reliably attracted to the frame 62. On the contrary, when there is leakage, it is determined that the attraction between the transfer arm 26a or 26b and the frame 62 is insufficient. Therefore, an operation failure in which the compartment variable device 60 does not operate normally can be recognized in advance. By performing the leakage checking using the pressure gauge 124, the reliability of the operation of the compartment variable device 60 can be improved.

The connecting mechanisms shown in FIGS. 6 to 8 are merely representative examples, and the connecting mechanism of the present invention is not limited thereto. A portion of the atmosphere-side transfer device 25 which is coupled to the compartment variable device 60 is not limited to the transfer arm 26a or 26b, and may be the fork 27a or 27b or may be any other portion as long as it is vertically movable. A portion of the compartment variable device 60 which is coupled to the atmosphere-side transfer device 25 is not limited to the frame 62, and may be, e.g., the baffle plate 61 or the bellows 63, or may be another portion as long as it is vertically movable.

(Gas Replacement Method)

Figure 9:
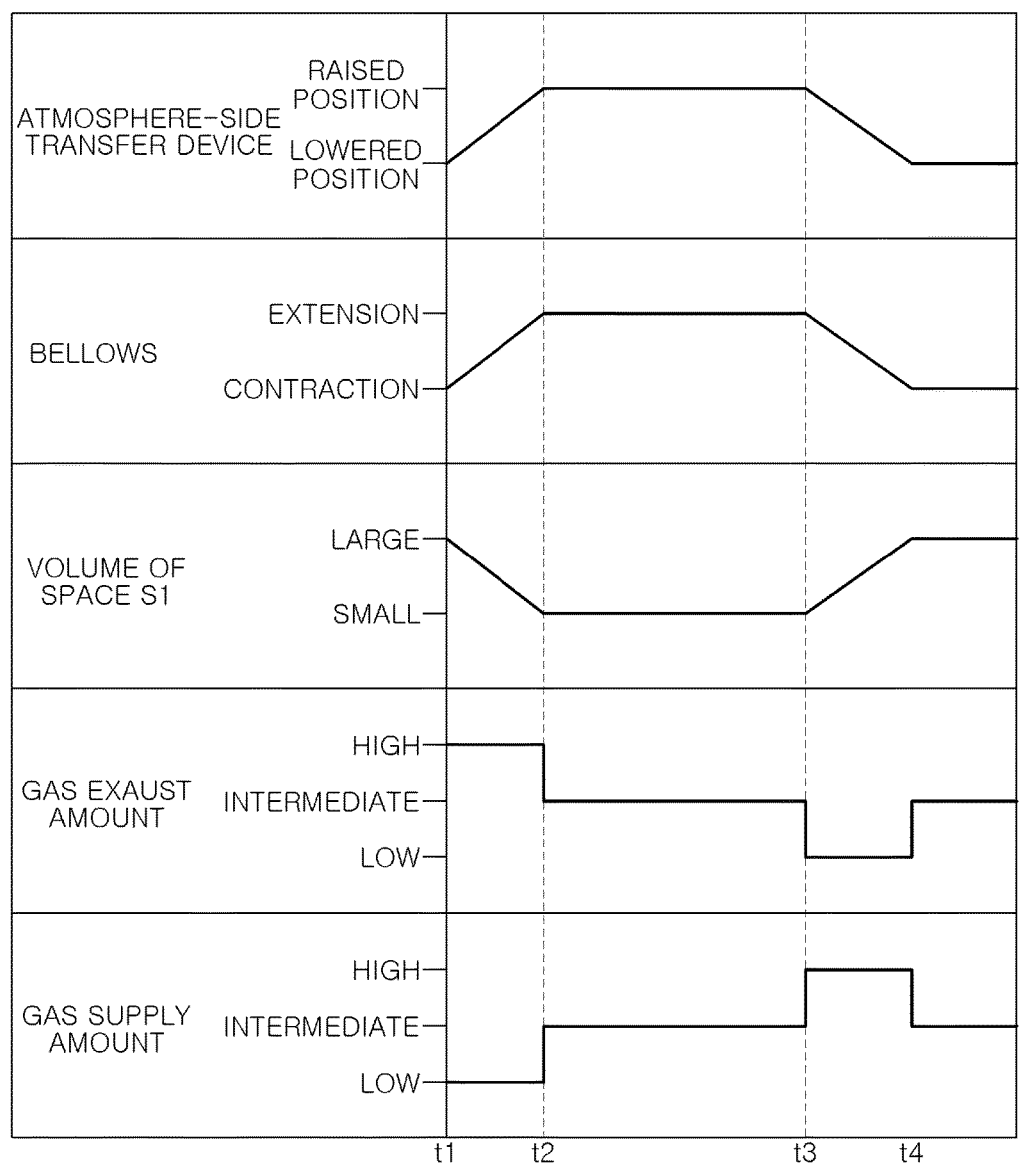
FIG. 9 is a timing chart of a method for replacing a gas according to an embodiment.

Next, a method for replacing a gas in the atmospheric pressure transfer chamber 14, which is performed while using the compartment variable device 60, will be described. FIG. 9 is a timing chart showing the operations of the atmosphere-side transfer device 25 and the bellows 63 at the time of replacing a gas in the atmospheric pressure transfer chamber 14, changes in the volume of the gas flow space S1, and changes in the gas exhaust amount and the gas supply amount. In FIG. 9, the horizontal axis represents time. Here, the case of replacing clean air with $N_2$ gas will be described as an example.

First, the atmosphere-side transfer device 25 and the compartment variable device 60 are coupled to each other. In that state, the atmosphere-side transfer device 25 is lifted during a period from time t1 to time t2. The bellows 63 of the compartment variable device 60 is extended by the movement of the atmosphere-side transfer device 25. As a consequence, the volume of the gas flow space S1 in the atmospheric pressure transfer chamber 14 is gradually decreased. On the contrary, the volume of the gas exhaust space S2 is gradually increased. From the time t1, $N_2$ gas is introduced into the gas flow space S1 from the $N_2$ gas supply source 35A through the gas inlet port 31a of the gas introducing part 31 and the FFU 45. The flow rate of the $N_2$ gas can be controlled by the mass flow controller 36. Also, the gas is exhausted through the gas exhaust part 32 at a flow rate controlled by the flow rate variable valve 40. During the period from the time t1 to the time t2, since a gas replacement speed is rate-controlled by an exhausting capacity, the gas exhaust amount is set to "high" and the $N_2$ gas supply amount is set to "low" among three levels of "high", "intermediate" and "low".

At the time t2, the lifting of the atmosphere-side transfer device 25 is stopped and the extension of the bellows 63 of the compartment variable device 60 is stopped. In other words, the decrease in the volume of the gas flow space S1 and the increase in the volume of the gas exhaust space S2 in the atmospheric pressure transfer chamber 14 are stopped. At the time t2, the gas exhaust amount and the gas supply amount are switched to "intermediate".

From the time t2 to time t3, the operations of the atmosphere-side transfer device 25 and the compartment variable device 60 are stopped and the replacement of the gas in the atmospheric pressure transfer chamber 14 is continued by supplying $N_2$ gas while exhausting the in a state where the volume of the gas flow space S1 of the atmospheric pressure transfer chamber 14 is constantly maintained. The degree of the gas replacement can be monitored by measuring an oxygen concentration, a moisture concentration or the like in the gas flow space S1 in the atmospheric pressure transfer chamber 14. For example, when clean air is replaced with $N_2$ gas, the end point of the gas replacement can be determined by determining whether or not the oxygen concentration or the moisture concentration in the atmospheric pressure transfer chamber 14 has reached a target level of a few ppm.

If the gas replacement is completed at the time t3, the atmosphere-side transfer device 25 is lowered during a period from the time t3 to time t4. The bellows 63 of the compartment variable device 60 is contracted by the movement of the atmosphere-side transfer device 25. As a consequence, the volume of the gas flow space S1of the atmospheric pressure transfer chamber 14 is gradually increased. On the contrary, the volume of the gas exhaust space S2 is gradually decreased. During the period from the time t3 to the time t4, since the gas replacement speed is rate-controlled by the gas supply capacity, the gas exhaust amount is set to "low" and the $N_2$ gas supply amount is set to "high" among the three levels of "high", "intermediate" and "low".

At the time t4, the lowering of the atmosphere-side transfer device 25 is stopped and the contraction of the bellows 63 of the compartment variable device 60 is stopped. In other words, the increase in the volume of the gas flow space S1 and the decrease in the volume of the gas exhaust space S2 in the atmospheric pressure transfer chamber 14 are stopped. At the time t4, the gas exhaust amount and the gas supply amount are switched to "intermediate". From the time t4, the inner space of the atmospheric pressure transfer chamber 14 is filled with $N_2$ gas by normal downward flow generated by the FFU 45 and maintained in a clean state. When the gas replacement in the atmospheric pressure transfer chamber 14 is completed, the connection between the atmosphere-side transfer device 25 and the compartment variable device 60 is released.

As described above, in the gas replacement method of the present embodiment, the volume of the gas flow space S1 of the atmospheric pressure transfer chamber 14 is varied by driving the compartment variable device 60 twice by performing the gas replacement once. Accordingly, the gas replacement speed can be increased and the throughput of the gas replacement can be improved. Since the gas replacement speed is increased by varying the volume of the gas flow space S1 of the atmospheric pressure transfer chamber 14, the amount of the gas, e.g., $N_2$ gas, to be used for the gas replacement can be reduced.

In the case of replacing $N_2$ gas in the atmospheric pressure transfer chamber 14 with clean air, the above-described processes may be performed in the same manner except that clean air is introduced into the gas flow space S1 through the air inlet port 35B, the gas inlet port 31a of the gas introducing part 31 and the FFU 45 from the time t1.

In the case of replacing air in the atmospheric pressure transfer chamber 14 with clean air after the maintenance operation, for example, the above-described processes may be performed in the same manner except that clean air is introduced and circulated in the gas flow space S1 through the gas exhaust port 33a of the gas circulation part 22, the circulation gas inlet port 31b and the FFU 45 from the time t1. In the case of performing a purification process while circulating $N_2$ gas in the atmospheric pressure transfer chamber 14, the above-described processes may be performed in the same manner. Even when the gas in the atmospheric pressure transfer chamber 14 is reused by circulation, the throughput of the gas replacement can be improved by the compartment variable device 60.

As described above, the substrate processing system of the present embodiment includes the compartment variable device 60 for substantially increasing or decreasing the volume of the gas flow space S1 by varying compartment of the gas flow space S1 in the atmospheric pressure transfer chamber 14 in cooperation with the atmosphere-side transfer device 25. Therefore, the throughput of the replacement of an atmosphere in the atmospheric pressure transfer chamber 14 is improved and the amount of clean gas to be used, e.g., $N_2$ gas or the like, can be reduced. Further, since the atmosphere-side transfer device 25 is used as a driving source of the compartment variable device 60, a dedicated actuator or the like is not required, which does not make the configuration of the apparatus complicated.

While the embodiments of the present invention have been described in detail, the present invention is not limited to the above embodiments and may be variously modified. For example, in the above embodiments, the substrate processing system 1 including four process modules 10A to 10D, two load-lock chambers 12A and 12B, the vacuum transfer chamber 11 and the atmospheric pressure transfer chamber 14 has been described as an example. However, the present invention may be applied to a substrate processing system having another configuration.

The processing target of the substrate processing system is not limited to the semiconductor wafer, and may be, e.g., a substrate for FPD, a substrate for solar panel or the like.

In the above embodiments, the bellows 63 is used as an extensible/contractible member of the compartment variable device 60. However, as for another mechanism that can be extended/contracted as in the case of the bellows 63, it is possible to use a tubular member made of, e.g., rubber, fabric, paper, synthetic resin or the like.

This application claims priority to Japanese Patent Application No. 2015-145398 filed on Jul. 23, 2015, the entire contents of which is incorporated herein by reference.

What is claimed is:

1. A substrate transfer chamber, comprising:
a transfer unit configured to transfer a substrate;
a gas supply unit configured to supply a gas into the substrate transfer chamber;
a gas exhaust unit configured to exhaust a gas in the substrate transfer chamber; and
a compartment variable device configured to vary compartment of a gas flow space in the substrate transfer chamber in cooperation with the transfer unit,
wherein the compartment variable device is connected to the transfer unit and configured to be moved by a movement of the transfer unit, and
wherein the compartment variable device varies the compartment of the gas flow space in the substrate transfer chamber by the movement of the transfer unit.

2. The substrate transfer chamber of claim 1, wherein the transfer unit is vertically movable, and
the compartment variable device varies the compartment of the gas flow space in the substrate transfer chamber by the vertical movement of the transfer unit.

3. The substrate transfer chamber of claim 2, wherein the compartment variable device includes:
a movable member which is movable vertically in the substrate transfer chamber; and
an extensible and contractible member which is extended and contracted by a movement of the movable member.

4. The substrate transfer chamber of claim 3, wherein the movable member is a rectifying plate having a plurality of openings and configured to rectify gas flow.

5. The substrate transfer chamber of claim 2, wherein a connecting mechanism for connecting the compartment variable device and the transfer unit is provided at one or both of the compartment variable device and the transfer unit.

6. The substrate transfer chamber of claim 5, wherein the connecting mechanism is a mechanical mechanism.

7. The substrate transfer chamber of claim 5, wherein the connecting mechanism is a suction mechanism.

8. The substrate transfer chamber of claim 5, wherein the connecting mechanism is an electrical attracting mechanism.

9. A substrate processing system, comprising:
a mounting unit configured to mount a transfer container accommodating a plurality of substrates;
a processing unit configured to perform predetermined processing on the substrates; and
a substrate transfer chamber provided between the mounting unit and the processing unit,
wherein the substrate transfer chamber includes:
a transfer unit configured to transfer the substrates between the transfer container mounted on the mounting unit and the processing unit;
a gas supply unit configured to supply a gas into the substrate transfer chamber;
a gas exhaust unit configured to exhaust a gas in the substrate transfer chamber; and
a compartment variable device configured to vary compartment of a gas flow space in the substrate transfer chamber in cooperation with the transfer unit,
wherein the compartment variable device is connected to the transfer unit and configured to be moved by a movement of the transfer unit, and
wherein the compartment variable device varies the compartment of the gas flow space in the substrate transfer chamber by the movement of the transfer unit.

10. A method for replacing a gas in a substrate transfer chamber for transferring a substrate, the substrate transfer chamber including a transfer unit configured to transfer the substrate, a gas supply unit configured to supply a gas into the substrate transfer chamber, a gas exhaust unit configured to exhaust a gas in the substrate transfer chamber, and a compartment variable device configured to vary compartment of a gas flow space in the substrate transfer chamber in cooperation with the transfer unit, wherein the compartment variable device is connected to the transfer unit and configured to be moved by a movement of the transfer unit, and wherein the compartment variable device varies the compartment of the gas flow space in the substrate transfer chamber by the movement of the transfer unit, the method comprising:
a first step of decreasing a volume of the gas flow space by the compartment variable device in a first exhaust state in which a large amount of gas is exhausted through the gas exhaust unit; and
a second step of increasing a volume of the gas flow space by the compartment variable device in a second exhaust state in which a relatively small amount of gas is exhausted through the gas exhaust unit.

11. The method of claim 10, wherein the first step is performed in a first supply state in which a small amount of gas is supplied from the gas supply unit, and the second step is performed in a second supply state in which a relatively large amount of gas is supplied from the gas supply unit.

12. The method of claim 10, wherein the transfer unit is vertically movable, and
the compartment variable device is configured to vary the compartment of the gas flow space in the substrate transfer chamber by the vertical movement of the transfer unit to decrease the volume of the gas flow space in a state where the transfer unit is lifted and increase the volume of the gas flow space in a state where the transfer unit is lowered.

* * * * *